United States Patent [19]

Salzer et al.

[11] 4,373,653
[45] Feb. 15, 1983

[54] METHOD AND APPARATUS FOR ULTRASONIC BONDING

[75] Inventors: Thomas E. Salzer, Bedford, Mass.; Michael S. Masheff, St. Petersburg, Fla.

[73] Assignee: Raytheon Company, Lexington, Mass.

[21] Appl. No.: 300,728

[22] Filed: Sep. 10, 1981

[51] Int. Cl.³ .............................................. B23K 21/02
[52] U.S. Cl. .................................... 228/104; 29/407; 156/61; 156/73.2; 156/378; 156/580.1; 228/110; 228/1 R; 228/56.5
[58] Field of Search ................... 156/73.1, 73.2, 580.1, 156/61, 378, 358; 228/110, 1 R, 1 A, 103, 56.5, 104; 29/407

[56] References Cited

U.S. PATENT DOCUMENTS

| | | | |
|---|---|---|---|
| 3,302,277 | 2/1967 | Pruden et al. | 228/110 |
| 3,458,921 | 8/1969 | Christensen | 228/110 |
| 3,763,545 | 10/1973 | Spanjer | 228/110 |
| 3,794,236 | 2/1974 | Salzer et al. | 228/1 |
| 3,827,619 | 8/1974 | Cusick et al. | 228/110 |
| 4,040,885 | 8/1977 | Hight et al. | 228/110 |

*Primary Examiner*—Michael G. Wityshyn
*Attorney, Agent, or Firm*—William R. Clark; Milton D. Bartlett; Joseph D. Pannone

[57] ABSTRACT

A method and apparatus for providing high reliability ultrasonic bonds by monitoring the force required to separate the bonding tool from the wire after the bonding operation. This force which is required to break an incidental bond between the tool and the wire is related to the quality of the primary bond of the wire to a conductor terminal. The output of a transducer is proportional to the force and it may be coupled to a visual display, alarm, or computer for trend analysis.

20 Claims, 5 Drawing Figures

4,373,653

METHOD AND APPARATUS FOR ULTRASONIC BONDING

BACKGROUND OF THE INVENTION

Ultrasonic bonding has many applications in the electronics industry. For example, it is common to attach solid-state components such as transistors or integrated circuits to a substrate or package. Frequently, the terminals of the components are then interconnected to each other or the conductor circuits of the substrate by small diameter wires that are attached by ultrasonic bonding. As is well known in the art, ultrasonic bonding may be performed by pressing the bonding tool or wedge against the wire contacting the terminal and then vibrating the tool at an ultrasonic frequency, such as, for example, 60 KHz. Various ultrasonic bonding machines having precise control over bonding parameters such as power, duration, downward force, and work piece positioning are commercially available and in wide usage.

A substantial semiconductor industry problem with ultrasonic bonding has been evaluating the quality of individual bonds. By providing an evaluation of the bond quality, the operator may alter operation of bond settings to get a higher quality yield. Also, the bonds of lower quality can be weeded out or discarded to provide a product having much higher predictable reliability. In many systems and particularly in military applications, reliability is of the utmost importance.

One prior art ultrasonic bonding evaluation method is to measure the required force to pull apart a certain percentage of the bonds. Although this method provides some data from which a prediction can be made regarding the reliability of the bonds not destroyed, it obviously does not sort the faulty bonds to increase reliability. Furthermore, this method is very time consuming, wasteful in that bonds are destroyed, and somewhat unreliable unless the destructive percentage is large.

Another prior art evaluation method for predicting bond reliability involves nondestructive pull testing in which the bonds are mechanically stressed to a preestablished level below the level that a good bond would pull apart. Other than being time consuming, this method provides no bond quality data about the force actually required to pull bonds apart. Also, this method damages some bonds that would otherwise be acceptable.

Another method which is described in U.S. Pat. No. 3,827,619 to Cusick et al, issued Aug. 6, 1974, utilizes a voltage which is proportional to the amplitude of the traverse motion of the ultrasonic bonding tool and a second voltage proportional to the tangential component of the force applied during bonding. In short, this method is based on the proposition that bond quality is proportional to the forces in the X and Y direction applied during the bonding process. Although this method may have been advantageous over the nondestructive pull type and destructive methods, there is a requirement to more accurately determine the actual quality of individual ultrasonic bonds.

SUMMARY OF THE INVENTION

It is an object of the invention to provide the operator with an output that is indicative of the quality of an individual ultrasonic bond.

It may be another object of the invention to store signals corresponding to the tool lift-off forces of ultrasonic bonds and provide statistical analysis relative to bonding quality trends.

These and other objects and advantages are provided by the invention which discloses a method for providing high reliability ultrasonic bonds comprising the steps of bonding a wire to a conductive terminal using an ultrasonic bonding tool, generating a signal corresponding to the force required to separate the tool from the wire, and providing a display in response to the signal for supplying the operator with data relating to the quality of the bond of the wire to the conductive terminal. It may be preferable that the wire be bonded to the terminal using a commercially available ultrasonic bonding apparatus. The wire may be round or ribbon-shaped. The conductive terminal may preferably be on an electronic component or a conductor circuit of a substrate. It may be preferable that the signal corresponding to the force required to separate or lift off the tool from the wire be generated by a transducer upon which the substrate is mounted. The display may comprise a voltmeter which is coupled to a charge amplifier connected between it and the transducer.

Instead of being connected to a display, the invention may also be practiced by coupling the signal to an operator alarm which is activated when the signal is outside a predetermined range. For example, the predetermined signal range may be a voltage range which corresponds to a lift-off force range of 10–30 grams.

The invention may also be practiced by coupling the generated signals to a digital computing apparatus for performing statistical operations relating to a plurality of the signals. For example, standard deviation could be computed. Also, long term trends relating to the bonding quality can be provided.

The invention also discloses a system for providing high reliability ultrasonic bonds comprising means for bonding a wire to a conductive terminal using an ultrasonic bonding tool, means for generating a signal corresponding to the force required to separate the tool from the wire, and means for providing a display in response to the signal for supplying the operator with data relating to the quality of the bond of the wire to the conductive terminal. It may be preferable that the signals be monitored for determining trends relating to the quality of the bonds of the wires to the conductive terminals.

The invention also discloses the combination of an ultrasonic bonding apparatus having a bonding tool, means for supporting a work piece adjacent to the tool for ultrasonically bonding on the work piece with the tool, means for generating a signal corresponding to the force required to separate the tool from the work piece after an ultrasonic bonding operation, and means for displaying the signal.

BRIEF DESCRIPTION OF THE DRAWINGS

The foregoing and other objects and advantages of the invention will more fully understood by reading the description of the preferred embodiment with reference to the drawings wherein.

DESCRIPTION OF THE PREFERRED EMBODIMENT

Figure 1:
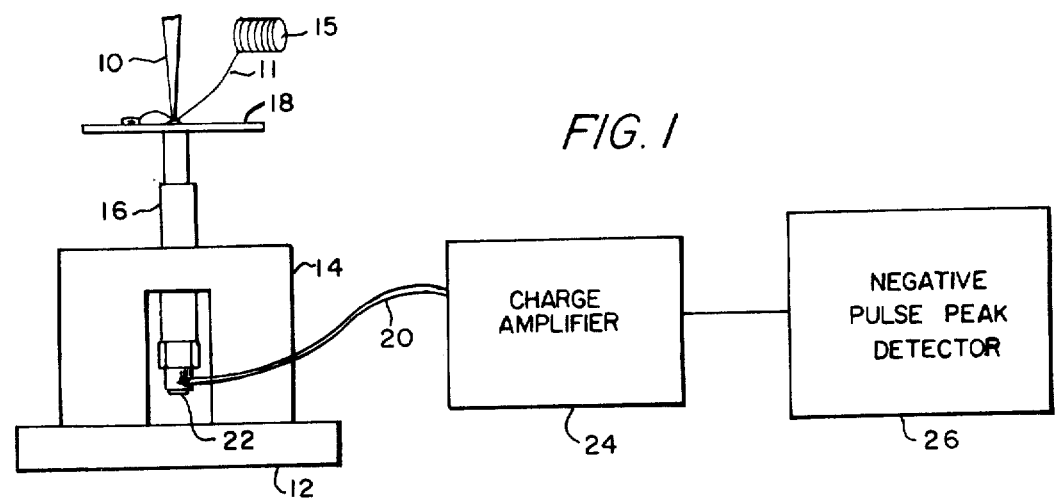
FIG. 1 is a pictorial and diagrammatic figure showing a system embodying the invention.

Referring to FIG. 1, there is shown a bonding tool 10 or bonding wedge which preferably is part of a commercially available ultrasonic wire bonder such as, for example, a model 484 ultrasonic wire bonder by Kulicke+Soffa Industries of Horsham, Pa. Ultrasonic wire bonders are in wide usage in the electronics industry and are commonly used to bond small diameter interconnecting wires between electronic components and conductor circuits of substrates. Typically, after the ultrasonic bonder parameters are set by the operator, precise positioning apparatus are used to locate the terminal of the component or circuit underneath tool 10. Microscopes are generally used to accurately position and inspect the bonding region. Then, the ultrasonic wire bonder is activated whereby the tool with the wire 11 in contact therewith is lowered until the wire contacts the terminal. With downward pressure, the tool is vibrated in the horizontal plane at a frequency such as, for example, 60 KHz. The wire is flattened where the bond is formed. Next, the tool is lifted off and the wire is fed from a spool 15 to the other end of the lead where the second bond is made. The wire on the spool side of the second bond is then cut resulting in a wire interconnection between the two terminals.

Figure 2:
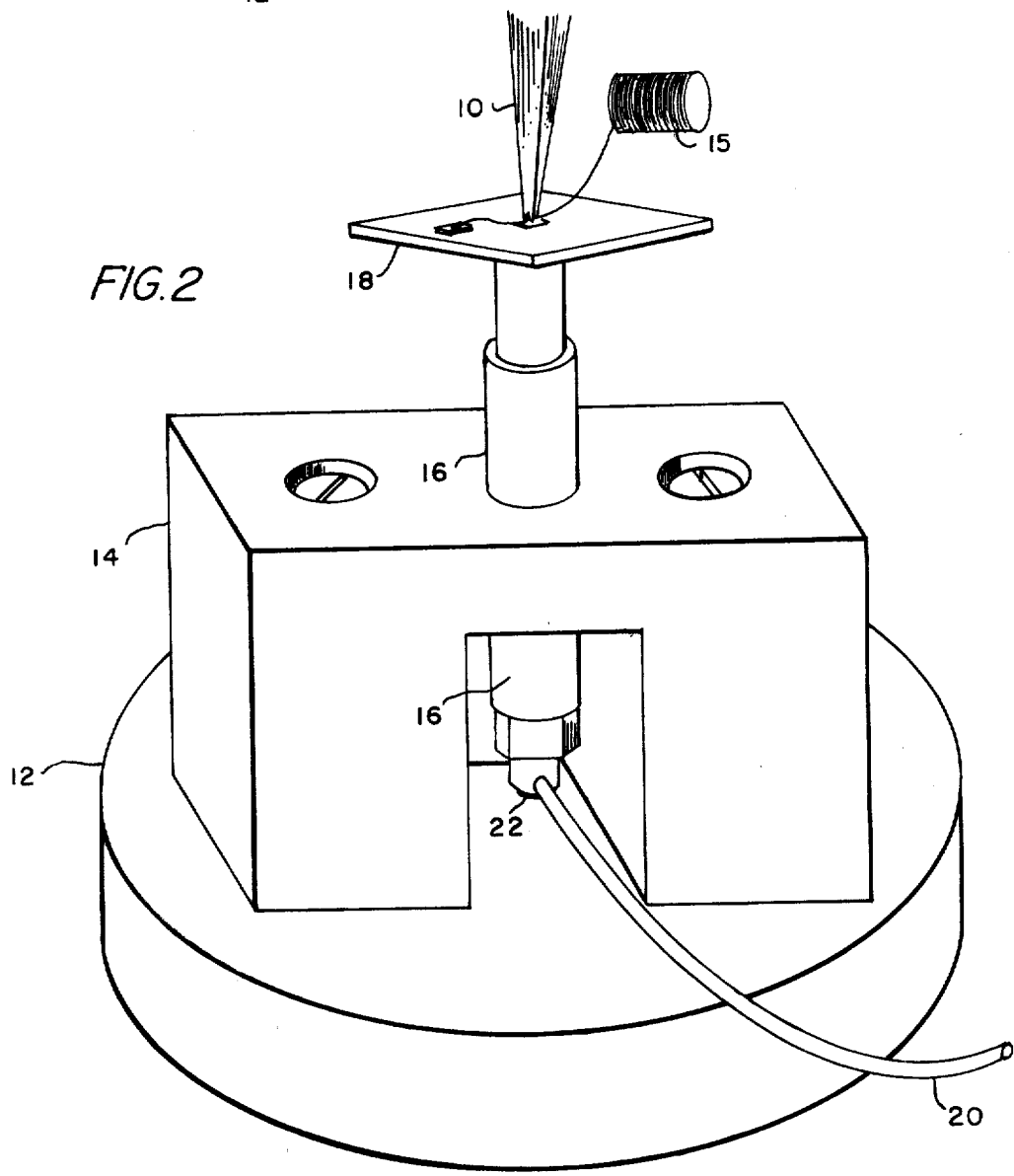
FIG. 2 is an expanded view of the bonding region as shown in FIG. 1.

Still referring to FIG. 1 and also to FIG. 2 which shows an expanded view, there is shown the chuck support pedestal 12 which is part of the commercially available ultrasonic wire bonder. Bonder chuck 14 functions to support transducer 16 to which the substrate 18 or work piece is connected. In a conventional system the bonder chuck is used to hold or clamp the substrate. Bonder chuck 14 may therefore be a conventional chuck which has been adapted to support transducer 16 or it may be any one of a number of new designs. The important feature is that transducer 16 is connected to substrate 18 so that the charge output of the transducer corresponds to the vertical forces applied to the substrate. Chuck 14 may be attached to the transducer and the transducer attached to the substrate using well-known techniques such as, for example, clamping or cementing. Also, some commercially available transducers are threaded such that they may be screwed into threads provided in chuck 14. In an alternate embodiment which is not shown herein, but one that would be obvious to those skilled in the art, the transducer could be mounted into the bonder mechanics above the tool rather than into chuck 14.

Figure 4:
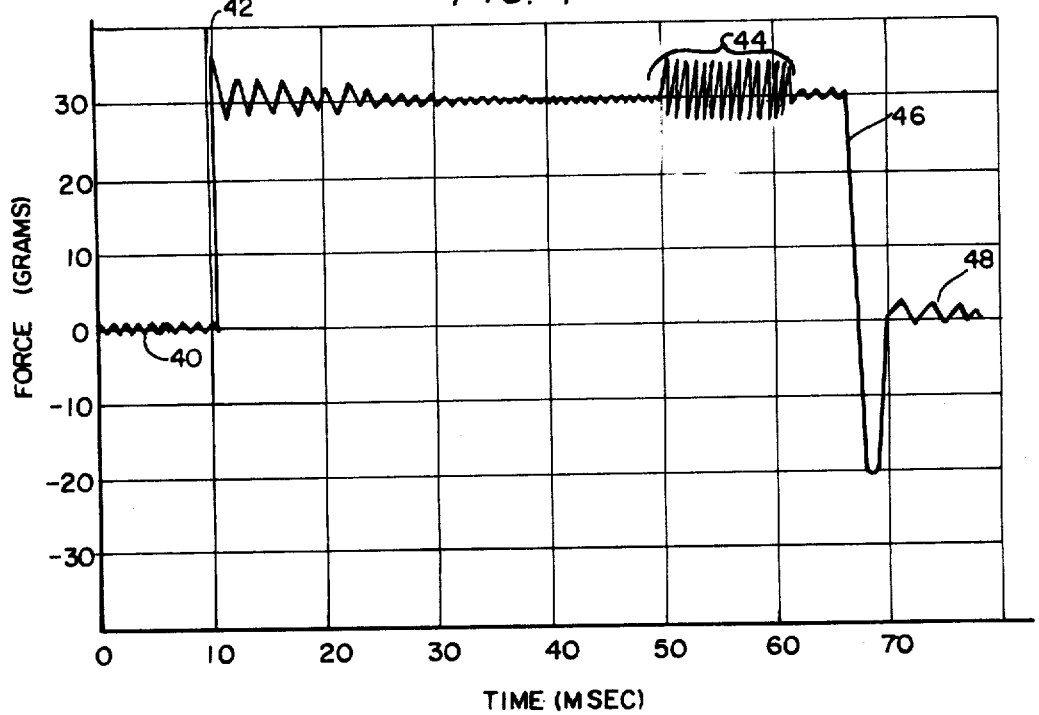
FIG. 4 is a plot representative of the force applied to the substrate by the tool as a function of time during a typical ultrasonic bonding operation.

Transducer 16 preferably is a quartz crystal type such as, for example, a commercially available model 9201 or 9203 from Kristler Instrument Corporation of Grand Island, N.Y. Model No. 9203 is threaded so that it can be screwed into chuck 14 for mounting. Although other types of transducers could be used, the quartz transducers exhibit the desirable features of high frequency response, small displacement even with large loads, sensitivity to small dynamic forces even under large static loads, and sensitivity to both negative and positive forces. Still referring to FIGS. 1 and 2, line 20 couples transducer connector 22 to charge amplifier 24. The charge signal on line 20 as provided by transducer 16 in response to vertical forces on substrate 18 is transformed into a proportional output voltage by charge amplifier 24 which preferably may be a model 5002 dual charge amplifier from Kristler Industries Corporation. In accordance with the invention, it has been determined that during an ultrasonic bonding process, not only does the wire bond to the terminal, but the wire also bonds to the bonding tool. Accordingly, when the tool is lifted off, an upward force is exerted on the wire and correspondingly the substrate before the bond between the tool and the wire breaks. Referring to FIG. 4, a plot of a typical dynamic force measurement of a wire bonding cycle is shown. From a zero force level at point 40, the tool with wire coupled thereto is lowered onto the bonding surface creating a downward or positive force as referenced herein; the time of impact is shown at point 42 followed by ringing. As shown, the force parameter may typically be about 30 grams. After the ringing has damped, the horizontal ultrasonic vibration is applied. Although predominantly in the horizontal plane, vertical components appear in the plot and are labeled 44. Then, when the tool is lifted off at point 46, an upward or negative force as referenced herein is required to break the bond between the tool and the wire. After the tool separates from the wire, the force on the substrate returns to the calibrated zero as shown at point 48.

In accordance with the invention, it has been determined that there is a correspondence between the primary bond of wire to the terminal and the incidental bond of the wire to the tool. Further, by monitoring the incidental bond, predictions about the quality of the primary bond can be made with very high confidence. The apparatus described heretofore provides a voltage which corresponds to the upward and downward forces on the substrate as caused by the tool and as shown in FIG. 4. Again referring to FIG. 1, this voltage is coupled to negative peak detector 26 for providing a visual operator display indicative of the peak lift-off force to remove the tool from the wire.

Figure 3:
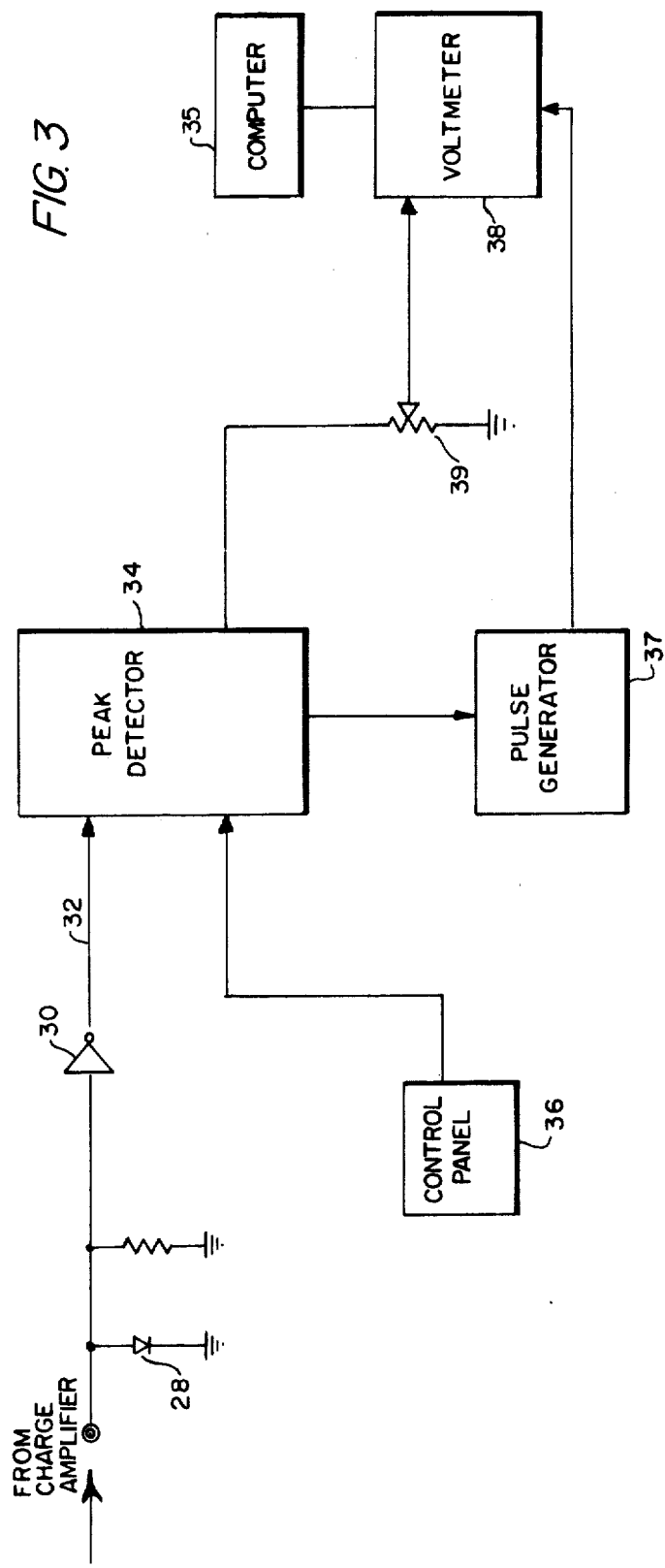
FIG. 3 is an exemplary circuit implementation of the negative pulse peak detector of FIG. 1.

Referring to FIG. 3, an exemplary circuit of negative pulse peak detector 26 of FIG. 1 is shown. The circuit of FIG. 3 is conventional and therefore will only be described briefly. Diode 28 at the input from charge amplifier 24 limits the signal swing in the positive direction. The input signal is coupled to inverter 30 which preferably comprises an operational amplifier. Accordingly, on line 32, the signal of interest which is the upward force on substrate 18 during the tool lift-off is of positive polarity. The downward force on substrate 18 caused by the tool during the bonding process corresponds to a negative voltage on line 32 and will not be detected by peak detector 34. Peak detector 34 may preferably comprise a Burr-Brown BB4085 Hybrid microcircuit peak detector. When peak detector 34 is in the detect mode as controlled by control panel 36, a positive voltage peak corresponding to the tool lift-off force may be detected causing the status indicator output of the peak detector to change logic states. In response to the status change, pulse generator 37 which may comprise a 74121 integrated circuit provides a pulse to voltmeter 38. Preferably, voltmeter 38 may comprise a digital voltmeter which in response to the pulse from the pulse generator samples and holds the voltage at its input and displays it on the voltmeter panel. Potentiometer 39 may be used to calibrate the system. Voltmeter 38 may also preferably provide an analog display. Furthermore, control panel 36 provides a way of resetting the system.

Still referring to FIG. 3, computer 35 is shown coupled to voltmeter 38. Although the bond machine may be monitored without the use of a computer such that the inclusion of computer 35 may be considered an alternate embodiment, more versatile operation may be provided with computer 35. For example, computer 35 which may be a microprocessor could receive all of the sampled data. From the sampled data, computer 35 could continuously calculate standard deviation. Also, computer 35 could alternate the acceptable range on even and odd bonds compensating for whether the bond was made to an electronic component or a circuit conductor pad. A bell could be sounded if a bond lift-off force fell out of the acceptable range for that particular type of bond. Also, computer 35 could alert the operator with regard to developing trends. Display data could be transferred back to the display panel of voltmeter 38.

Imperical test results conclusively show that there is a distinct relationship between bond strength and lift-off force. For low lift-off forces, bonds are underformed and weak due to lack of adhesion between the wire and terminal. On the other hand, for very large lift-off forces, the bonds become weak due to overdeforming the wire resulting in a very thin heel of the wire bond. Hence, there is a optimum range of lift-off forces that varies as a function of the bonding materials used and the bonding parameter settings of the bonder machine. More specifically, the relationship between bond strength and lift-off force is affected by the composition of the wire (or ribbon), the composition of the bonding surface, the size of the wire, the size of the bonding tool, and several other parameters. In short, for the particular application, it may be preferable to conduct controlled experiments measuring lift-off forces and compare these to their respective bond strengths as determined by destructive testing. Accordingly, an optimum range can be determined for the particular application and future bond lift-off forces compared against the standard to insure high reliability of bonds. Test data has been taken for a variety of applications and the conclusion that there is a distinct relationship between bond strength and lift-off force has always been confirmed. This is true even when the substrate has been contaminated.

Figure 5:
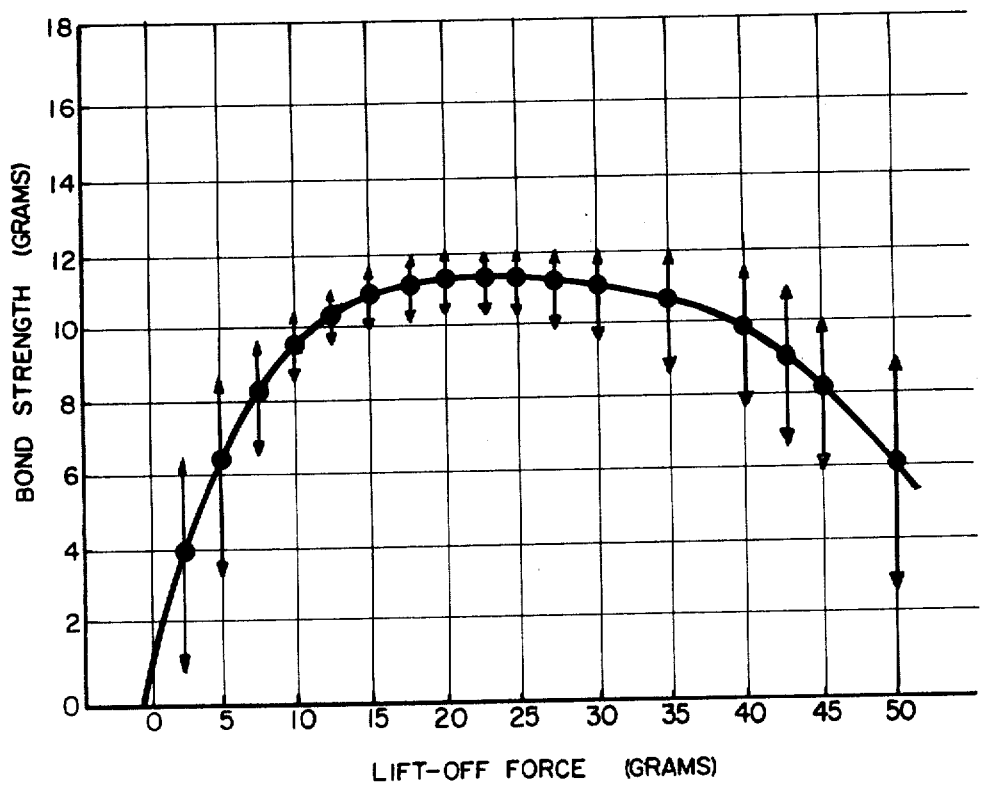
FIG. 5 is representative of actual data taken plotting bond strength versus lift-off force.

Referring to FIG. 5, test data using a one-half inch by one one-half inch gold-chrome sputtered alumina substrate and a 1 mil 99 percent aluminum, 1 percent silicon round wire is shown. The tool force during bonding was maintained at 30 grams for a constant bonding period. The connected dots represent the average bond strengths for the respective lift-off forces. The vertical arrowed lines from the dots show the standard deviations. The region of the graph below 5 grams lift-off force represents predominantly poor quality bonds for which the failure mode was typically separation of the bond foot from the terminal during pull testing. Generally, inspection showed that the wire was not sufficiently deformed to create an acceptable bond to the terminal. The region between 5-10 grams lift-off force represents a transition region where the bond strengths may be low and where some of the failures are wire failures instead of bond failures. The region between 10-35 grams lift-off force represents all wire failures and the standard deviation is very low. Above 35 grams lift-off force, the failure mode remains in the wire but the strength begins to fall because of excessive thinning of the wire at the heel between the bond and the lead wire. In summary, the results of the data indicated that for the particular application under test, a high degree of reliability could be attained by accepting only bonds in a given range such as, for example 10–35 grams.

The invention has been described with reference to a particular embodiment. However, the reading of this disclosure will bring to mind many modifications and alterations without departing from the spirit and scope of the invention. Accordingly, it is intended that the scope of the invention be limited only by the following claims.

What is claimed is:

1. A method for providing high reliability ultrasonic bonds comprising the steps of:
   bonding a wire to a conductive terminal using an ultrasonic bonding tool;
   generating a signal corresponding to the force required to separate said tool from said wire; and
   providing a display in response to said signal for supplying the operator with data relating to the quality of the bond of said wire to said conductive terminal.

2. The method recited in claim 1 wherein said signal is generated by a transducer connected to the substrate of said conductive terminal.

3. The method recited in claim 1 wherein said display comprises a digital voltmeter.

4. A method for detecting poor quality ultrasonic bonds comprising the steps of:
   bonding a wire to a conductive terminal using an ultrasonic bonding tool;
   generating a signal corresponding to the force required to separate said tool from said wire; and
   providing an operator alarm in response to said signal being outside a predetermined range.

5. The method recited in claim 4 wherein said signal is generated by a transducer connected to the substrate of said conductive terminal.

6. The method recited in claim 4 wherein said alarm comprises an audio alarm.

7. A method for providing high reliability ultrasonic bonds comprising the steps of:
   bonding wires to respective conductive terminals using an ultrasonic bonding tool;
   generating signals corresponding to the respective forces required to separate said tool from said wires after each individual bond is made; and
   coupling said signals to a digital computing apparatus for performing statistical operations relating to a plurality of said signals.

8. A method for providing high reliability ultrasonic bonds comprising the steps of:
   bonding wires to respective conductive terminals using an ultrasonic tool;
   generating signals corresponding to the respective forces required to separate said tool from said wires after each individual bond is made; and
   monitoring a plurality of said signals for determining trends relating to the quality of bonds of said wires to said conductive terminals.

9. A system for providing high reliability ultrasonic bonds comprising:
   means for bonding a wire to a conductive terminal using an ultrasonic bonding tool;
   means for generating a signal corresponding to the force required to separate said tool from said wire; and means for providing a display in response to said signal for supplying the operator with data relating to the quality of the bond of said wire to said conductive terminal.

10. The system recited in claim 9 wherein said generating means comprises a transducer coupled to the substrate of said conductive terminal.

11. The system recited in claim 9 wherein said providing means comprises a digital voltmeter.

12. The system recited in claim 9 wherein said providing means comprises a digital computer.

13. A system for providing high reliability ultrasonic bonds comprising:
- means for bonding a wire to a conductive terminal using an ultrasonic bonding tool;
- means for generating a signal corresponding to the force required to separate said tool from said wire; and
- means for monitoring a plurality of successive said signals for determining trends relating to the quality of bonds of said wires to said conductive terminals.

14. The system recited in claim 13 wherein said generating means comprises a transducer coupled to the substrate of said conductive terminal.

15. The system recited in claim 14 wherein said generating means further comprises a charge amplifier.

16. The system recited in claim 13 wherein said monitoring means comprises a digital computer.

17. In combination:
- an ultrasonic apparatus having a bonding tool;
- means for supporting a work piece adjacent to said tool for ultrasonically bonding a wire to said work piece with said tool;
- means for generating a signal corresponding to the force required to separate said tool from said wire after an ultrasonic bonding operation; and
- means for displaying said signal.

18. The combination in accordance with claim 17 wherein said generating means comprises a transducer coupled to said supporting means.

19. The combination in accordance with claim 17 wherein said displaying means comprises a digital voltmeter.

20. The combination in accordance with claim 17 further comprising a digital computer for storing a plurality of successive said signals and computing a trend relative thereto.

* * * * *